United States Patent [19]

Chao et al.

[11] Patent Number: 5,413,817
[45] Date of Patent: May 9, 1995

[54] METHOD FOR ADHERING METAL COATINGS TO POLYPHENYLENE ETHER-POLYSTYRENE ARTICLES

[75] Inventors: Herbert S. Chao, Schenectady; Carol L. Fasoldt, Nassau, both of N.Y.

[73] Assignee: General Electric Company, Schenectady, N.Y.

[21] Appl. No.: 147,509

[22] Filed: Nov. 5, 1993

[51] Int. Cl.$^6$ .............................................. B05D 3/10
[52] U.S. Cl. ................................... 427/306; 427/304; 427/383.1; 427/404; 427/443.1; 205/169; 205/224; 205/927
[58] Field of Search ............... 205/927, 224, 169; 427/304, 306, 383.1, 404, 443.1, 305

[56] References Cited

U.S. PATENT DOCUMENTS 3,471,320  10/1969  Saubestre et al. ............... 427/306
3,556,955  1/1971   Ancker et al. .................... 205/927
4,781,788  11/1988  Forsterling et al. ............. 427/306
5,290,597  3/1994   Baumgartner et al. .......... 427/306
5,316,867  5/1994   Chao et al. ...................... 427/304

Primary Examiner—Shrive Beck
Assistant Examiner—Katherine A. Bareford
Attorney, Agent, or Firm—William H. Pittman

[57] ABSTRACT

Substrates comprising blends of at least one polyphenylene ether and at least one poly(alkenylaromatic compound) (e.g., polystyrene) are treated with aqueous tetravalent cerium in a concentration of at least about 0.1 M, preferably acidified with nitric acid, to improve adhesion to metal coatings subsequently deposited nonelectrolytically; for example, by electroless deposition. The metallized articles are heat treated following metal deposition. Further metal coatings may be deposited, preferably followed by further heat treatment.

13 Claims, No Drawings

METHOD FOR ADHERING METAL COATINGS TO POLYPHENYLENE ETHER-POLYSTYRENE ARTICLES

This invention relates to the metallization of plastic surfaces, and more particularly to a metallization method useful with thermoplastic blends of polyphenylene ethers and poly(alkenylaromatic compounds).

Metallized plastics have become of interest in recent years as a replacement for metal in such articles as automobiles, enclosures for electrical appliances, microwave ovens, business machines and the like. When fabricated of plastics alone, such enclosures are inadequate to shield internal parts from external radiation sources such as electromagnetic interference, particularly radio frequency interference, and static electricity, and also to prevent escape of internally generated radiation. Such sources of interference can be blocked out by providing a metal coating on the surface of the plastic substrate, typically by electroless or electrolytic deposition. Metallization is also desirable for the formation of printed circuit boards, whereupon the entire surface or a portion thereof is metallized and is then masked and etched in areas where metal traces are not desired.

One of the most serious problems which arise in the metallization of plastics is the lack of adhesion of the metal layer to the substrate. The principal method for improving adhesion of metal layers to the surfaces of polyphenylene ether-poly(alkenylaromatic compound) (hereinafter sometimes "PPE-PS") substrates involve treatment with chromic acid. However, chromic acid treatment is no longer possible because of the environmental hazards presented by the resulting sludge.

Alternative adhesion promoting methods employing less corrosive materials, environmentally safe and capable of recycle, are desirable. One such method is provided by the present invention.

Accordingly, the invention is a method for metallizing a resinous substrate comprising a thermoplastic mixture of at least one polyphenylene ether and at least one poly(alkenylaromatic compound), said method comprising the steps of:

contacting at least a portion of said surface with aqueous tetravalent cerium in a concentration of at least about 0.1 M, non-electrolytically depositing a metal layer on said surface; and heat treating the metal-coated surface at a temperature in the range of about 50°–80° C. for at least about 10 minutes.

The plastic substrates treated according to the present invention comprise blends of polyphenylene ethers and poly(alkenylaromatic compounds). The polyphenylene ethers are known polymers comprising a plurality of structural units of the formula

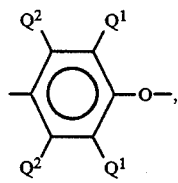

wherein in each of said units independently, each $Q^1$ is independently halogen, primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$. Most often, each $Q^1$ is alkyl or phenyl, especially $C_{1-4}$-alkyl, and each $Q^2$ is hydrogen.

Both homopolymer and copolymer polyphenylene ethers are included. The preferred homopolymers are those containing 2,6-dimethyl-1,4-phenylene ether units. Suitable copolymers include random copolymers containing such units in combination with (for example) 2,3,6-trimethyl-1,4-phenylene ether units. Also included are polyphenylene ethers containing moieties prepared by grafting onto the polyphenylene ether in known manner such materials as vinyl monomers or polymers such as polystyrenes and elastomers, as well as coupled polyphenylene ethers in which coupling agents such as low molecular weight polycarbonates, quinones, heterocycles and formals undergo reaction in known manner with the hydroxy groups of two polyphenylene ether chains to produce a higher molecular weight polymer, provided a substantial proportion of free OH groups remains.

The polyphenylene ether generally has a number average molecular weight within the range of about 3,000–40,000 and a weight average molecular weight within the range of about 20,000–80,000, as determined by gel permeation chromatography. Its intrinsic viscosity is most often in the range of about 0.15–0.6 dl./g., as measured in chloroform at 25° C.

The polyphenylene ethers are typically prepared by the oxidative coupling of at least one monohydroxyaromatic compound such as 2,6-xylenol or 2,3,6-trimethylphenol. Catalyst systems are generally employed for such coupling; they typically contain at least one heavy metal compound such as a copper, manganese or cobalt compound, usually in combination with various other materials.

Particularly useful polyphenylene ethers for many purposes are those which comprise molecules having at least one aminoalkyl-containing end group. The aminoalkyl radical is typically located in an ortho position to the hydroxy group. Products containing such end groups may be obtained by incorporating an appropriate primary or secondary monoamine such as di-n-butylamine or dimethylamine as one of the constituents of the oxidative coupling reaction mixture. Also frequently present are 4-hydroxybiphenyl end groups, typically obtained from reaction mixtures in which a by-product diphenoquinone is present, especially in a copper-halide-secondary or tertiary amine system. A substantial proportion of the polymer molecules, typically constituting as much as about 90% by weight of the polymer, may contain at least one of said aminoalkyl-containing and 4-hydroxybiphenyl end groups.

It will be apparent to those skilled in the art from the foregoing that the polyphenylene ethers contemplated for use in the present invention include all those presently known, irrespective of variations in structural units or ancillary chemical features.

The poly(alkenylaromatic compounds) employed in the PPE-PS blends include homopolymers and copolymers of such compounds as styrene, α-methylstyrene, 4-methylstyrene and dibromostyrene. Styrene is generally preferred. Particularly preferred are conventional rubber-modified polystyrenes, sometimes designated "high impact polystyrene" or "HIPS".

It is known that polyphenylene ethers and poly(alkenylaromatic compounds) are miscible in all proportions. While PPE-PS blends containing any proportion of the two resins may be employed in the invention, it is preferred that the polyphenylene ether be present in the amount of at least about 50% and most preferably at least about 60% by weight, based on the two polymers.

The PPE-PS blend may also contain conventional additives, especially flame retardant additives and impact modifiers. Flame retardant additives include brominated styrenes and phosphorus-containing chemicals such as triphenyl phosphate, tri-t-butyphenyl phosphate, tetraphenyl resorcinol bisphosphate, tetraxylyl resorcinol bisphosphate, tetraphenyl hydroquinone bisphosphate and tetraxylyl hydroquinone bisphosphate.

Impact modifiers for polyphenylene etherpoly(alkenylaromatic compound) blends are known. They include diblock and triblock copolymers of alkenylaromatic compounds such as styrene and aliphatic dienes such as butadiene and isoprene.

Prior to the method of this invention, it is frequently preferred to clean the surface of the substrate with a conventional detergent or degreasing agent. Typical degreasing agents are halohydrocarbons, especially chlorofluorohydrocarbons such as 1,1,2-trichlorotrifluoroethane.

An essential step in the method of the invention is contact of the resin surface, or at least the portion thereof to be metallized, with aqueous tetravalent cerium. Any compound of tetravalent cerium may be employed; examples are cerium sulfate and cerium ammonium nitrate. The latter is often preferred by reason of its availability and particular suitability.

While not mandatory, it is strongly preferred that all the cerium be in solution in the aqueous phase. This may be accomplished, even when employing a sparingly soluble tetravalent cerium compound, if an acidic aqueous solution is employed. The preferred acid is nitric acid; its concentration is generally up to about 12 N.

At high proportions of flame retardant in the PPE-PS blend (typically above about 20 parts per 100 parts of resin), the nitric acid concentration frequently has a noticeable effect on the peel strength of the metal layer. For copper, optimum peel strengths are observed at a concentration of about 1.0–5.5 N; for nickel, about 5–12 N.

The concentration of tetravalent cerium in the aqueous medium is at least about 0.1 M and preferably about 0.2–0.5 M. The treatment temperature is in the range of about 40°–65° and preferably about 55°–65° C. Treatment time is not critical but is generally at least about 5 minutes; times greater than about 20 minutes are generally not necessary.

One advantage of the method of this invention is the relative ease of recycling cerium salts in the used solution. The method causes reduction of tetravalent to trivalent cerium. Reoxidation may be easily achieved, most often by electrochemical means.

Following the tetravalent cerium treatment, it is usually preferred to rinse the substrate surface with water.

After the tetravalent cerium treatment step has been performed, a metal layer is deposited non-electrolytically on the surface of the substrate. Such deposition may be by conventional methods such as electroless deposition.

The invention is particularly advantageous with electroless metal deposition. Such deposition may be by conventional methods involving art-recognized, commercially available reagents. Methods of this type generally begin with a pretreatment to aid in the absorption of the electroless deposition catalyst, typically with a reagent such as Shipley Cleaner-Conditioner 1175A which is an alkaline solution containing organic compounds. This may be followed by surface activation employing, for example, Shipley Cataprep ® 404 containing sodium bisulfate and various surfactants; and then by treatment with an acidic palladium-containing solution as catalyst, illustrated by Shipley Cataposit ® 44 which comprises tin and palladium compounds, the palladium being the principal catalytic species.

After a water rinse, the substrate may be immersed in a solution of Shipley Cuposit ® Accelerator 19, a fluoboric acid-containing formulation used to remove tin, or an equivalent thereof. It may then be further rinsed with water and treated with one or more electroless plating solutions.

Electroless plating baths are well known in the art and are generally described, for example, in Kirk-Othmer, *Encyclopedia of Chemical Technology*, Third Edition, Volume 8, the contents of which are incorporated herein by reference. The selection of a particular electroless plating bath or process is not critical to the invention. The contents of the bath and the plating parameters such as temperature, pH and immersion time will of course depend on the metal to be deposited. Suitable plating baths include Shipley Cuposit ® 250 and 251 and Enthone Enplate ® NI-426. The former two are electroless copper solutions and the latter an electroless nickel solution.

Following metallization by electroless deposition, the metal layer is heat-treated at a temperature in the range of about 50°–80° C., preferably about 70°–80° C., for a period of time sufficient to stabilize adhesion of the metal to the resin surface. Said time period is at least 10 minutes and typically from 30 minutes to about 2 hours.

At least one further metal coating, preferably of copper, may be deposited on the substrate after the initial non-electrolytic metal deposition. Deposition of said further coating may be by conventional methods including electroless and electrolytic deposition, the details of which are likewise known to those skilled in the art. Following deposition of further metal coatings, it is strongly preferred to further heat-treat the metal surface at a similar temperature, in this instance for a period from about 30 minutes to about 5 hours.

Metallized articles comprising resinous substrates as defined hereinabove which have been subjected to treatment by the above-described method are another aspect of the invention. They have substantially improved adhesion of the metal to the resin surface, in comparison with untreated substrates, as measured by the "peel strength" method (IPC method 2.4.8). In this method, strips of tape, 3.2 mm. wide, are used to mask portions of the metallized surface after deposition of electrolytic copper and the exposed copper is etched away with concentrated nitric acid. The substrate is rinsed thoroughly in water, after which the force required to remove one or more of the remaining copper strips by peeling it away at 90° is measured.

The invention is illustrated by the following examples. All percentages are by weight.

EXAMPLE 1

Test strips, 2.5×15.2 cm., were prepared from a PPE-PS blend comprising 64.32% of a commercially available poly-(2,6-dimethyl-1,4-phenylene ether) and 35.68% of a commercially available HIPS, and including 21.28 parts of tetraphenyl resorcinol bisphosphate per 100 parts of resin (phr.) as a flame retardant additive and various other conventional additives in minor proportions The substrates were cleaned with a commercially available detergent at 50° C., rinsed with water for 2 minutes and contacted with an aqueous solution 0.27 M in cerium ammonium nitrate and 5.2 N in nitric acid for 10 minutes at 60° C.

The test substrates were then coated with an electroless copper layer by the following scheme of operations:
Water rinse—2 minutes;
Shipley Cleaner-Conditioner 1175A—5 minutes, 2.5% by volume, 75° C.;
Water rinse—2 minutes;
Shipley Cataprep 404—1 minute, 270 g/l;
Shipley Cataposit 44—3 minutes, 1.5% by volume, with Cataprep 404 at 270 g/l, 44° C.;
Water rinse—2 minutes;
Shipley Accelerator 19—3 minutes, 16% by volume;
Water rinse—2 minutes;
Shipley Cuposit ® plating solution—1 or 2 minutes, 48° C.;
Water rinse—2 minutes.

The copper-plated substrates were heat treated for 1 hour at 75° C. and electroplated with copper for 60 minutes in an acid bath at a current density of 0.032 A/cm.$^2$. The resulting thick copper coatings were masked with strips of tape 3.2 mm. wide and the exposed copper was etched with concentrated nitric acid. After thorough rinsing, the tape was removed and the substrates were heat-treated for 1, 2, 3 and 4 hours at 75° C., after which peel strength was determined. The results are given in Table I, in comparison with a control which included no cerium treatment.

TABLE I

|  | Control | Sample 1 | Sample 2 | Sample 3 | Sample 4 |
|---|---|---|---|---|---|
| HNO$_3$ conc., N | — | 5.2 | 5.2 | 1.6 | 10.9 |
| Time, min.: |  |  |  |  |  |
| Ceric salt treatment | — | 5 | 10 | 10 | 10 |
| Electroless plating | 2 | 2 | 2 | 1 | 1 |
| Peel strength, g./mm.: |  |  |  |  |  |
| 1 hr. heat treatment | NA* | 71.6 | 64.4 | 77.0 | 28.6 |
| 2 hrs. heat treatment | NA | 80.6 | 77.0 | 57.3 | 44.8 |
| 3 hrs. heat treatment | NA | 102.0 | 87.7 | 84.1 | 62.7 |
| 4 hrs. heat treatment | NA | 82.3 | 84.1 | — | — |

NA-no adhesion.

The results in Table I show that substantial improvement in peel strength was demonstrated upon treatment by the method of the invention.

EXAMPLE 2

Test substrates identical to those of Example 1 was treated with cerium ammonium nitrate and metallized by the same sequence of steps as Sample 1 of Example 1, except that the electroless copper treatment was replaced by electroless nickel treatment with Enthone Enplate ® NI-426 solution for 5, 10 or 15 minutes at 53° C. and a pH of 6.2. The results are given in Table II.

TABLE II

|  | Control | Sample 5 | Sample 6 | Sample 7 | Sample 8 | Sample 9 |
|---|---|---|---|---|---|---|
| HNO$_3$ conc., N | — | 5.2 | 5.2 | 5.2 | 1.6 | 10.9 |
| Time, min. |  |  |  |  |  |  |
| Ceric salt treatment | — | 5 | 10 | 10 | 10 | 10 |
| Electroless plating | 10 | 10 | 10 | 15 | 5 | 5 |
| Peel strength, g./min.: |  |  |  |  |  |  |
| 1 hr. heat treatment | NA | 82.3 | 80.6 | 94.9 | 10.7 | 80.6 |
| 2 hrs. heat treatment | NA | 80.6 | 87.7 | 94.9 | 28.6 | 78.8 |
| 3 hrs. heat treatment | NA | 80.6 | 82.3 | 102.0 | 26.9 | 84.1 |
| 4 hrs. heat treatment | NA | 80.6 | 80.6 | — | — | — |

EXAMPLE 3

The procedures of Examples 1 and 2 were repeated, except that the substrates comprised a blend of PPE, 35% HIPS, 13.5 phr. tri-t-butylphenyl phosphate and minor amounts of other conventional additives and the ceric salt treatment time was 10 minutes. The results are given in Table III.

TABLE III

|  | Sample 10 | Sample 11 | Sample 12 | Sample 13 | Sample 14 | Sample 15 |
|---|---|---|---|---|---|---|
| Electroless metal | Cu | Cu | Cu | Ni | Ni | Ni |
| HNO$_3$ conc., N | 1.6 | 5.2 | 10.9 | 1.6 | 5.2 | 10.9 |
| Electroless plating time, min. | 1 | 1 | 1 | 5 | 15 | 5 |
| Peel strength, g./min.: |  |  |  |  |  |  |
| 1 hr. heat treatment | 48.3 | 69.8 | 51.9 | 43.0 | 64.4 | 51.9 |
| 2 hrs. heat treatment | 59.1 | 68.0 | 53.7 | 55.5 | 64.4 | 48.3 |
| 3 hrs. heat treatment | 53.7 | 59.1 | 53.7 | 60.9 | 57.3 | 53.7 |
| 4 hrs. heat treatment | — | 57.3 | — | — | 66.2 | — |

What is claimed is:

1. A method for metallizing a resinous substrate comprising a thermoplastic mixture of at least one polyphenylene ether and at least one poly(alkenylaromatic compound), said method comprising the steps of:
   contacting at least a portion of said surface with aqueous tetravalent cerium in a concentration of at least about 0.1 M,
   non-electrolytically depositing a metal layer on said surface; and
   heat treating the metal-coated surface at a temperature in the range of about 50°–80° C. for at least about 10 minutes.

2. A method according to claim 1 wherein the metal layer is deposited by electroless deposition.

3. A method according to claim 2 wherein the aqueous cerium solution also contains nitric acid in a concentration no greater than about 12 N.

4. A method according to claim 3 wherein the substrate comprises blend of at least one poly(2,6-dimethyl-1,4-phenylene ether) and at least one polystyrene.

5. A method according to claim 4 wherein the polystyrene is a rubber-modified polystyrene.

6. A method according to claim 4 wherein the cerium concentration is about 0.2–0.5 M.

7. A method according to claim 4 wherein temperature of the cerium solution during contacting is in the range of about 40°–65° C.

8. A method according to claim 4 wherein the metal is nickel or copper.

9. A method according to claim 4 wherein at least one further metal coating is deposited on the substrate after the electroless metal deposition.

10. A method according to claim 9 wherein the metal-coated surface is further heat treated at a temperature in the range of about 50+−80° C. for at least about 30 minutes after the deposition of further metal coatings.

11. A method according to claim 10 wherein the further metal coating is copper.

12. A method according to claim 10 wherein the further metal coating is deposited by electroless deposition.

13. A method according to claim 10 wherein the further metal coating is deposited electrolytically.

* * * * *